United States Patent [19]

Eindhoven et al.

[11] Patent Number: 5,278,095

[45] Date of Patent: * Jan. 11, 1994

[54] METHOD FOR MAKING PASSIVATED MESA SEMICONDUCTOR

[75] Inventors: Willem G. Eindhoven, Belle Mead, N.J.; Linda J. Down, Syosset, N.Y.

[73] Assignee: General Instrument Corporation, Hatboro, Pa.

[ * ] Notice: The portion of the term of this patent subsequent to Dec. 25, 2007 has been disclaimed.

[21] Appl. No.: 921,900

[22] Filed: Jul. 29, 1992

Related U.S. Application Data

[60] Division of Ser. No. 884,325, May 11, 1992, Pat. No. 5,166,769, which is a continuation of Ser. No. 660,914, Feb. 27, 1991, abandoned, which is a continuation of Ser. No. 537,894, Jun. 13, 1990, abandoned, which is a continuation of Ser. No. 365,519, Jun. 13, 1989, Pat. No. 4,980,315, which is a continuation-in-part of Ser. No. 219,071, Jul. 18, 1988, abandoned.

[51] Int. Cl.⁵ .......................................... H01L 21/22
[52] U.S. Cl. .................................. 437/141; 437/952; 437/956
[58] Field of Search ............... 437/138, 141, 158, 247, 437/952, 958, 956; 148/DIG. 39, DIG. 145

[56] References Cited

U.S. PATENT DOCUMENTS

| 3,832,246 | 8/1974 | Lynch | 437/158 |
| 4,210,472 | 7/1980 | Hoffman et al. | 437/904 |
| 4,740,477 | 4/1988 | Einthoven et al. | 437/141 |
| 4,757,031 | 7/1988 | Kuhnert et al. | 437/958 |
| 4,980,315 | 12/1990 | Einthoven et al. | 437/952 |

Primary Examiner—Brian E. Hearn
Assistant Examiner—C. Chaudhari
Attorney, Agent, or Firm—Barry R. Lipsitz

[57] ABSTRACT

A process for forming a semiconductor device begins by diffusing an N layer having a relatively high concentration into a P wafer having a relatively low concentration. Next, the wafer is etched to yield a plurality of mesa semiconductor structures, each having a P-N junction intersecting a sidewall of the mesa structure. Then, a layer of oxide is grown on the sidewalls of the mesas, which oxide layer passivates the device. The oxidizing step curves the P-N junction toward the P layer in the vicinity of the oxide layer. Then, the P-N junction is diffused deeper into the P layer with a diffusion front which tends to curve the P-N junction back toward the N layer in the vicinity of the oxide layer. This diffusion is carried out to such an extent as to compensate for the curvature caused by the oxidizing step and thereby substantially flatten the P-N junction. A plurality of successive oxidation/diffusion steps can be undertaken to further flatten the junction adjacent the mesa sidewall. The resultant P-N junction has a greater breakdown voltage in the vicinity of the oxide layer due to the substantial flatness of the P-N junction. The decreased concentration gradient of the linearly graded junction in the vicinity of the oxide layer caused by the oxidizing step increases the breakdown voltage in the vicinity of the oxide layer above the bulk breakdown voltage.

7 Claims, 7 Drawing Sheets

METHOD FOR MAKING PASSIVATED MESA SEMICONDUCTOR

This application is a division of co-pending U.S. patent application Ser. No. 07/884,325 now U.S. Pat. No. 5,166,769 filed on May 11, 1992, which was a continuation of Ser. No. 07/660,914 filed on Feb. 27, 1991, now abandoned, which was a continuation of Ser. No. 07/537,894 filed on Jun. 13, 1990, now abandoned, which was a continuation of Ser. No. 07/365,519 filed on Jun. 13, 1989, now U.S. Pat. No. 4,980,315, which was a continuation in part of Ser. No. 07/219,071 filed on Jul. 18, 1988, now abandoned.

BACKGROUND OF THE INVENTION

The invention relates generally to processes for forming P-N junctions in semiconductor devices, and to the resultant devices. The invention relates more particularly to a process for forming a passivated P-N junction in a mesa structure. The passivation layer is formed by growing silicon dioxide on the mesa sidewall. This invention relates more specifically to a method to compensate for the curvature in the P-N junction which occurs during the oxidation and thus keep the P-N junction relatively plane.

U.S. Pat. No. 4,740,477 to Einthoven et al issued Apr. 26, 1988 discloses a semiconductor device having a P+/N−/N+ junction in a mesa structure, which patent is hereby incorporated by reference as part of the present disclosure. The mesa can be formed by an anisotropic etch, and the walls of the mesa slope outwardly from a top surface thereof toward the N−/P+ junction. After the mesa is etched, the highly concentrated N+ region is diffused more deeply into the mesa but not below the base of the mesa, and the diffusion adjacent to the sidewall of the mesa takes on a generally concave shape relative to the N− layer as it penetrates into the N− layer. The result is that the thickness of the lightly doped N− region adjacent to the sidewall of the mesa is greater than the thickness of the lightly doped region at the interior regions. Consequently, electric fields adjacent to the sidewall of the mesa are reduced and the tendency for surface breakdown is reduced. The mesa also includes a grown silicon dioxide layer surrounding its sidewall to passivate the device.

While the structure of U.S. Pat. No. 4,740,477 has proven highly effective and useful, in some applications, particularly those requiring a low cost junction, it is desirable to provide a diffused P-N junction with bulk breakdown without the intervening lightly doped region.

Attempts have been made to passivate a diffused P-N junction with a grown oxide layer to prevent parasitic breakdown. However, the resultant breakdown occurred adjacent to the oxide layer because the oxidizing step curves the portion of the P-N junction adjacent to the oxide layer toward the P layer.

A general object of the present invention is to provide a process for making a P-N junction with a greater breakdown voltage adjacent to the oxide layer than exhibited by the aforesaid diffused P-N junction portion, for a given bulk breakdown.

Another general object of the present invention is to provide a P-N junction of the foregoing type in a mesa structure which structure is passivated with a grown silicon dioxide layer around its sidewall.

Another general object of the present invention is to provide semiconductor devices of the foregoing types which are useful as zener and other types of diodes that in essence exhibit avalanche breakdown in the bulk region.

Another general object of the present invention is to compensate the curving of the diffused P-N junction portion adjacent to the oxide layer by subsequent diffusions and oxidations which curve the P-N junction in opposite directions.

SUMMARY OF THE INVENTION

The invention resides in a process for forming a semiconductor device as well as the resultant device. The process begins by diffusing a shallow, relatively high concentration, N+ layer in a relatively low concentration, P region to form a P-N junction. Next, the wafer is etched from the N+ layer into the P region to form a plurality of mesa semiconductor structures, each having a P-N junction intersecting a sidewall of the mesa structure. Next, according to one feature of the invention, an oxide layer is grown on the sidewall of the mesa to passivate the device. However, the oxidizing step curves the P-N junction toward the P region in the vicinity of the oxide layer. Then, the P-N junction is diffused deeper into the mesa with a diffusion front which tends to curve the P-N junction toward the N+ layer in the vicinity of the passifying oxidation. The diffusion is carried out to such an extent as to compensate for the curvature caused by the oxidizing step and thereby substantially flatten the P-N junction. Either the oxidizing and diffusing steps can be carried out separately, or they can be carried out as one continuous step. Alternately, the order of the oxidizing and second diffusing steps can be reversed with the result that the curvatures caused by these steps offset one another. Subsequent oxidation and diffusion steps are carried out to improve the compensation for the curvature still further.

The resultant semiconductor device comprises a mesa semiconductor structure having a substantially flat P-N junction which intersects the sidewall of the mesa structure and a grown oxide layer on the sidewall of the mesa structure to passivate the device. The P-N junction in the vicinity of the passifying oxide layer exhibits a curvature which generally resembles a cosine wave, with the number of cycles dependent on the number of successive oxidation and diffusion steps carried out.

BRIEF DESCRIPTION OF THE FIGURES

FIG. 6 also illustrates the effect of such passivation on the shape of the P-N junction. For purposes of explanation, the curvature of the junction adjacent to the oxide layer has been exaggerated.

FIG. 8 further illustrates in exaggerated fashion the effect of the oxidation on the shape of the P-N junction.

FIGS. 9(a) and 9(b) are included only to illustrate generally how a second diffusion step tends to curve a P-N junction.

DETAILED DESCRIPTION OF THE PREFERRED EMBODIMENTS

Figure 1:
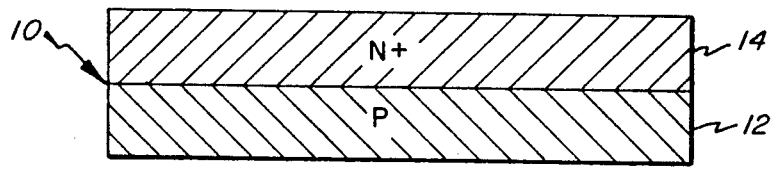
FIG. 1 is a view in cross-section, not to scale, taken along a plane intersecting a radius of a P-type wafer which has been doped to a certain depth with N+ impurities. The doped wafer is used to subsequently form a multiplicity of P-N junctions according to the present invention. The N+ layer is shown greatly enlarged in thickness while the P layer is also enlarged but to a much lesser degree.

Referring now to the drawings in detail wherein like reference numerals indicate like elements throughout the several views, FIG. 1 illustrates a P-type wafer 12 and an N+ dopant layer 14 forming a P-N semiconductor junction generally designated 10. As described in more detail below, rectifiers according to the present invention are formed from this junction.

Wafer 12 preferably has a resistivity in the range of 0.003 ohm centimeters to 0.1 ohm centimeters, but can also have a high resistivity estimated as high as 10 ohm centimeters. By way of example, P-N junction 10 is formed by depositing at 920° for 40 minutes phosphorus from POCl$_3$ on a P-type, boron doped wafer having a resistivity of approximately 0.05 ohm centimeters. This yields a sheet resistance in the N+ layer which is approximately 16 ohms/sq. at the surface. Then, a first stage of a first diffusion step is carried out by subjecting the wafer to 1100° C. for 5 hours (e.g., in nitrogen gas). This yields a preliminary P-N junction (not shown) which is approximately 6 microns deep and an N+ phosphorus layer 14 having a sheet resistance of approximately 1.5 ohms/sq. Next, a final stage of the first diffusion step is carried out as follows. The phosphorus oxide layer created on the surface of the wafer during the first stage of the first diffusion step is stripped, a protecting nitride layer is deposited on the entire surface of the wafer, and the wafer is subjected to 1250° C. in nitrogen gas to two additional hours to yield P-N junction 10.

It should be noted that for the deposition step, both stages of the first diffusion step, and subsequent oxidation and diffusion steps described below, the wafer is initially placed in a relatively cool furnace and then the temperature of the furnace is raised gradually, for example, 5° C./minute to prevent thermal shock. Similarly, after each step is completed, the furnace temperature is gradually cooled. The duration specified herein for each step begins when the temperature reaches the specified level and ends when the temperature drops below the specified level even though some activity takes place during warm-up and cool-down.

Figure 2:
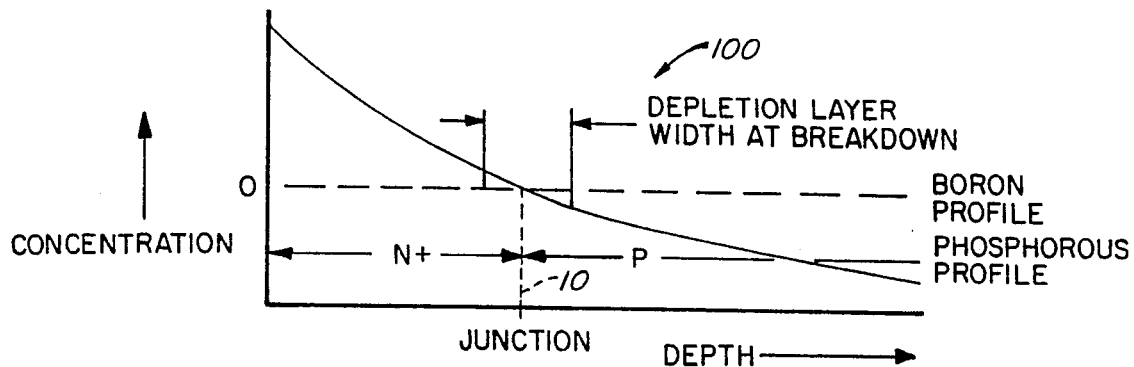
FIG. 2 is a graph illustrating the N+ and P concentration profiles of the wafer of FIG. 1, but is not drawn to scale.

After completion of this first diffusion step (both stages), the concentration profiles 100 of both the N+ and P impurities in the wafer are illustrated in FIG. 2. The surface of the wafer has an N+ concentration of approximately $10^{20}$ atoms/cm$^3$, which concentration decreases beneath the surface. At the junction 10, the N+ concentration equals the P concentration with a net concentration of zero. Slightly above and slightly below junction 10, the net concentration is proportional to the distance from the junction, and this range is referred to as the "linear region" of a "linearly graded" junction. The concentration gradient in the linear region is preferably in the range $10^{18}$ to $10^{24}$ atoms/cm$^4$ (more preferably $10^{20}$ to $10^{24}$ atoms/cm$^4$), and in the aforesaid example is approximately $10^{22}$ atoms/cm$^4$. It is also preferable for the present invention that the depletion region at breakdown does not spread beyond the linear region so that the slope of the concentration profile at the junction determines the breakdown voltage. Generally, the steeper the slope, the lower the breakdown voltage. It is also desirable to provide a junction which is plane or flat because such a junction has a higher breakdown voltage than a curved junction. As a result of the first diffusion step described above, junction 10 is plane or flat. This results from the fact that the diffusion is uniform across the surface of the wafer.

Figure 3:
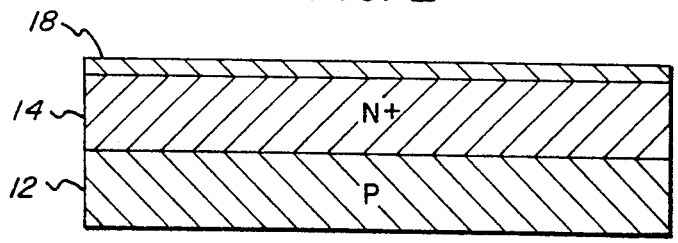
FIG. 3 is a view in cross-section, not to scale, taken along the same plane as FIG. 1 of the wafer coated with silicon nitride in a subsequent fabrication step of the present invention.

In the next step of the present invention as illustrated in FIG. 3, a silicon nitride layer 18 is deposited on top of the N+ region 14. By way of example, such deposition is provided by low pressure chemical vapor deposition and yields a layer 2000 angstroms thick.

Figure 4:
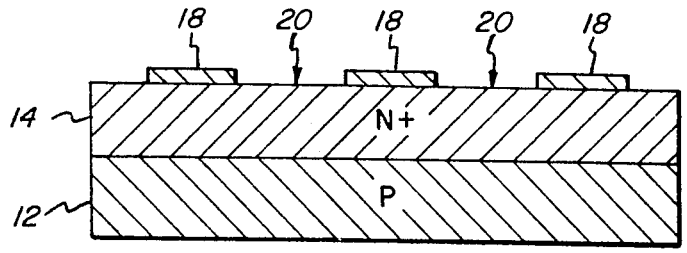
FIG. 4 is a view in cross-section, not to scale, taken along the same plane as FIG. 3, of the wafer of FIG. 3 provided with island masks formed from the silicon nitride according to a subsequent fabrication step in the present invention.

Next, a conventional masking and etching technique is used to form an island pattern in the silicon nitride layer as illustrated in FIG. 4. The island pattern in silicon nitride layer 18 results from the removal of silicon nitride in the areas designated 20, so that the silicon nitride 18 remains only in the areas shown.

Figure 5:
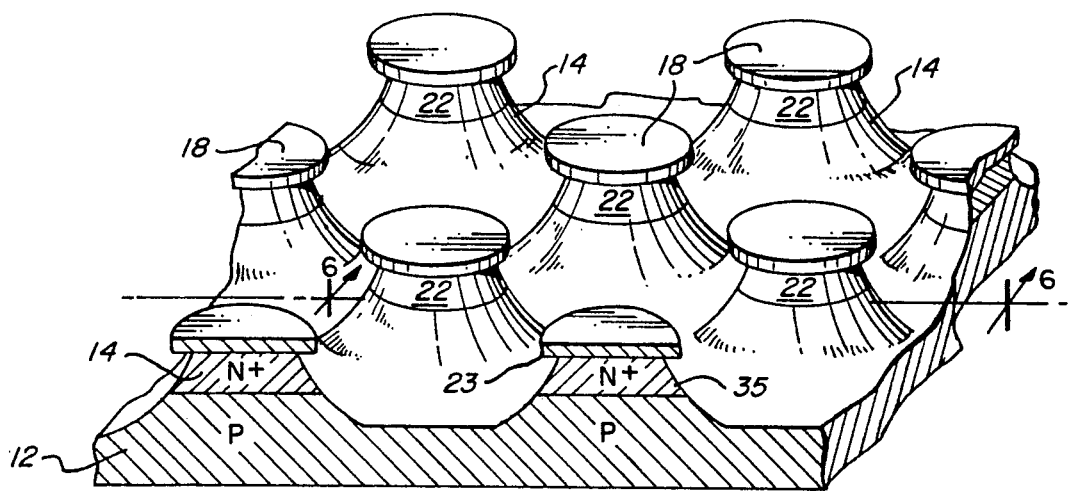
FIG. 5 is a perspective view, not to scale, of mesa structures formed from the wafer of FIG. 4 with the aid of the masks.

Next, according to the present invention, the wafer is isotropically etched using the silicon nitride layer 18 as a mask to yield three-dimensional mesas 22 as shown in FIG. 5. By way of example, the etching utilizes an acid comprising 5 parts nitric acid, 3 parts hydrofluoric acid, and 3 parts acetic acid. In this example, the wafer is exposed to the acid for 1½ minutes at approximately 15° C. This yields moats which are approximately 30-35 microns deep, and extend below the P-N junction. The P-N junction lies between ⅓ and ⅔ of the height of the mesa. In the preferred embodiment of the invention, the mesas are concave and generally frustum-shaped with a sidewall slope of approximately 10°-20° from vertical.

The cross-sectional shape of each mesa in the plane parallel to the wafer is determined by the mask island pattern in the silicon nitride layer 18. If the mask island pattern comprises a multiplicity of circular islands as illustrated in FIG. 5, then each mesa has a circular cross-section in the aforesaid plane. However, if a square mask pattern is utilized, each mesa will have a generally square cross-section with rounded corners in the aforesaid plane. Other cross-sectional shapes of the mesa are feasible.

As further illustrated by FIG. 5, each of the mesas comprises an upper silicon nitride layer 18, an adjacent, underlying N+ region 14, and a P region 12 of the wafer underlying the N+ layer. Also, the P-N junction within each mesa is flat, even at the sidewall of the mesa.

Next, overhanging portions 23 of the silicon nitride layers 18 are removed by a mechanical operation such as scrubbing.

Figure 6:
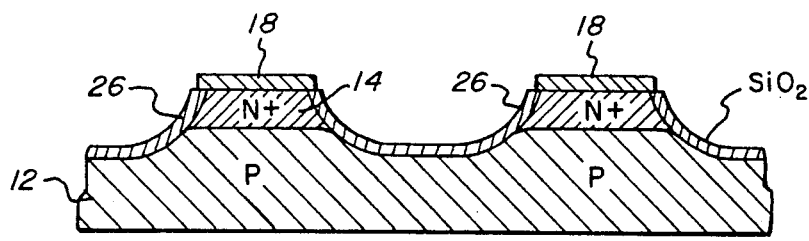
FIG. 6 is a view in cross-section, not to scale, of mesa structures taken along the plane indicated by line 6—6 of FIG. 5 which structures have been scrubbed to trim the island masks and passivated on their sidewalls with a grown layer of silicon dioxide.

Next, according to the present invention, a thick, passifying silicon dioxide layer 26, preferably greater than ½ micron thick and for example, 1.9 microns thick, is grown on the structure of FIG. 5. While other types of oxidizing techniques such as deposition are possible, the grown oxide layer is preferable because it is denser and more homogeneous than a deposited oxide layer. By way of example, the wafer is subjected to steam at 1100° C. for 8 hours to yield the grown oxide layer. It should be noted that the oxide layer grows only on the exposed silicon but does not grow on the silicon nitride 18. The result is illustrated in FIG. 6 which shows silicon dioxide layer 26 on the walls of each mesa and in the valleys between the mesas. The oxide layer on the sidewall of each mesa passivates the device because silicon dioxide can withstand significantly high electrical fields than silicon, and the surface of each mesa sidewall is rendered impervious to harmful environmental effects, making the surface electrically stable. This helps to prevent parasitic breakdown at the surface of the silicon. However, the oxidizing step changes the shape of the P-N junction.

Figure 7C:
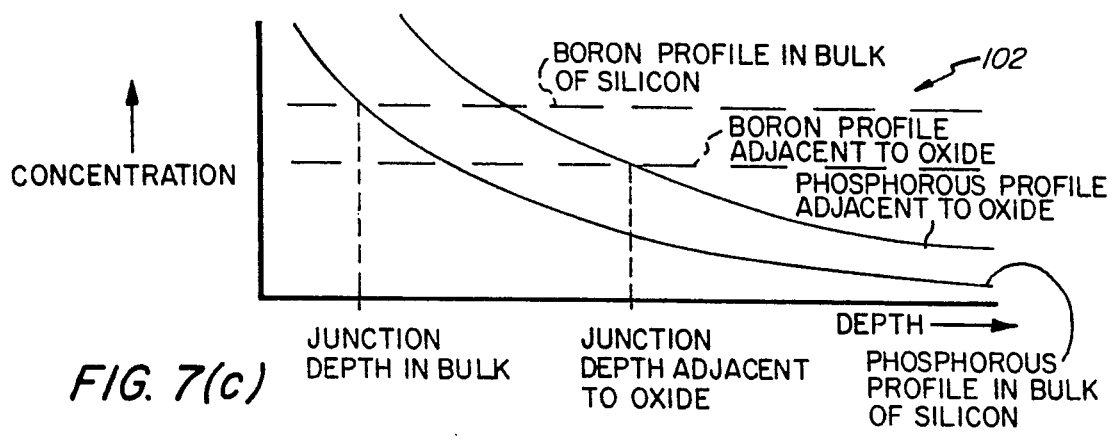
FIG. 7(c) is a graph, not to scale, illustrating the concentration profiles of the N+ and P dopants adjacent to the sidewall and in the interior or bulk of the mesa structure after the oxidizing step of FIG. 6.
Figure 7A:
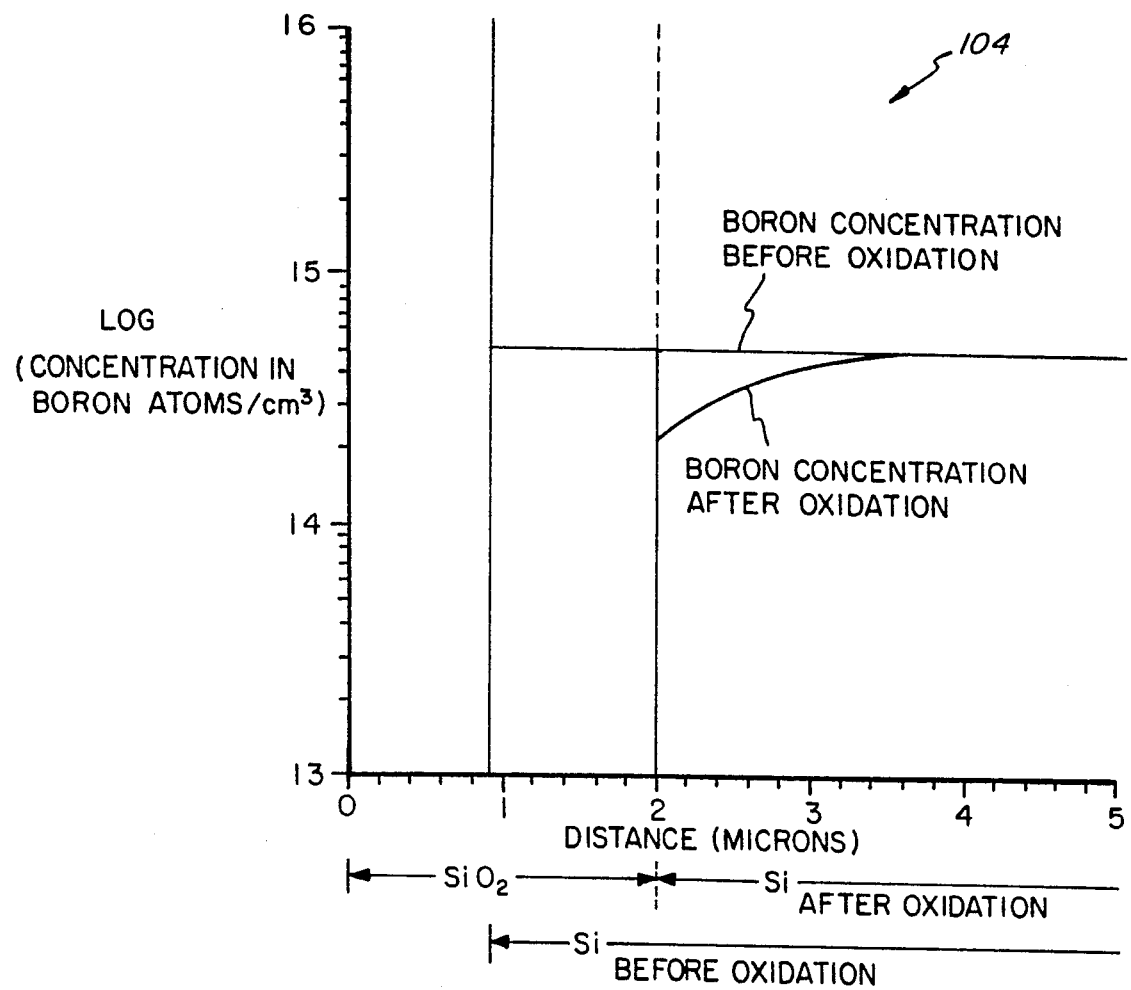
FIG. 7(a) is a graph of boron concentration as a function of depth before and after the oxidation illustrated in FIG. 6 for 8 hours at 1100° C. in steam, of a wafer doped with $5 \times 10^-$boron atoms/cm$^3$. The boron concentration at the new silicon surface has dropped nearly a factor of 2.
Figure 7B:
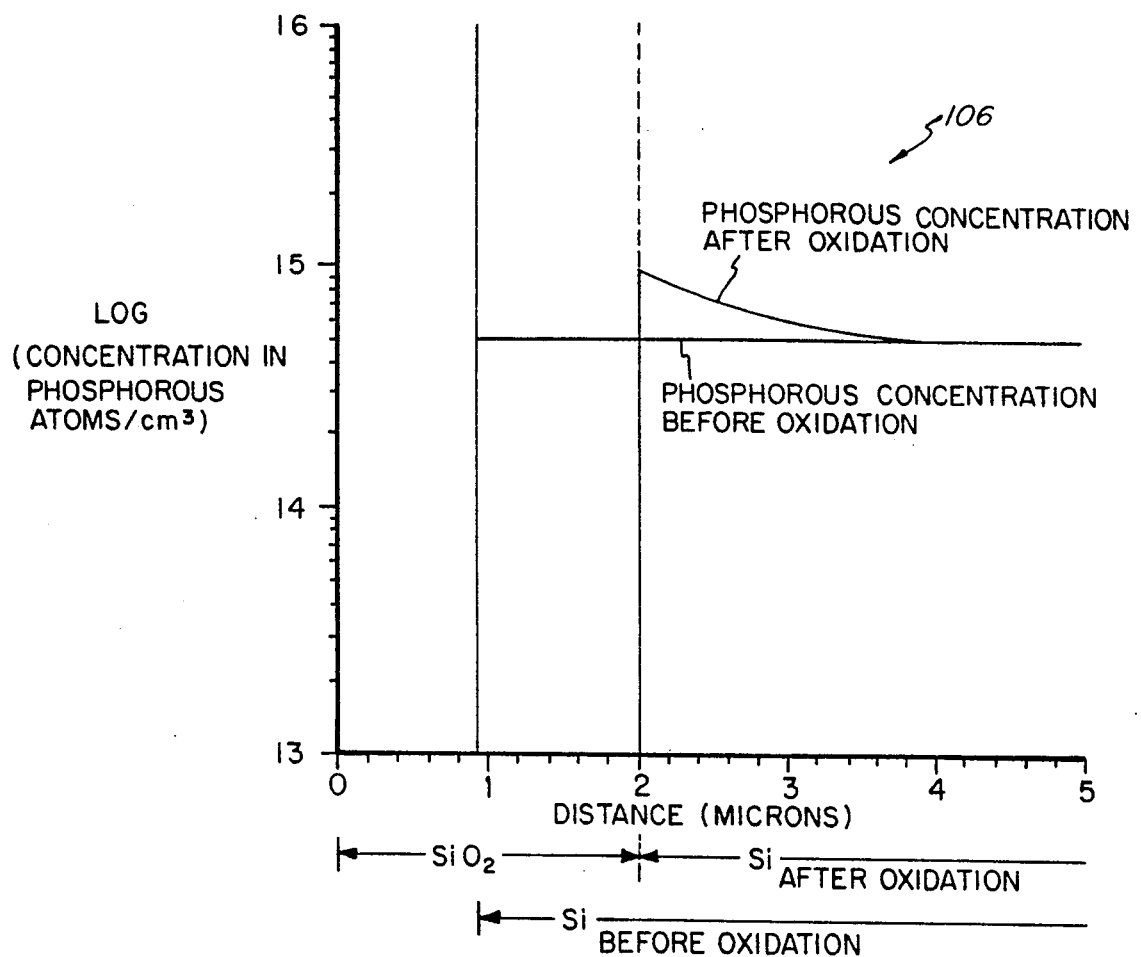
FIG. 7(b) is a graph of the phosphorus concentration as a function of depth before and after the oxidation illustrated in FIG. 6 for 8 hours at 1100° C. in steam, of a wafer doped with $5 \times 10^-$phosphorus atoms/cm$^3$. The phosphorus concentration at the new silicon surface has increased nearly a factor of 2.

As illustrated in FIG. 7(a) at 104 and 7(b) at 106, during oxidation a redistribution of the boron and phosphorus atoms occurs in the vicinity of the oxide layer.

Figure 8:
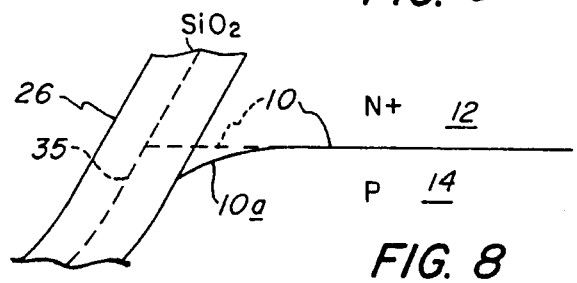
FIG. 8 is a greatly enlarged, fragmentary schematic view of one portion of FIG. 6 in which portion the P-N junction meets the silicon dioxide layer.

As illustrated in FIG. 7(c) at 102, this results in a P-N junction depth which is greater adjacent to the oxide layer than in the bulk, and a curving of the P-N junction away from the N+ layer as shown in FIG. 8. Portion 10a of the junction adjacent to the oxide layer 26 is concave relative to N+ layer 14.

FIG. 7(c) also shows that the concentration gradient of the junction adjacent to the oxide is lower than the concentration gradient in the bulk. This means an increased breakdown voltage adjacent to the oxide layer. This increase will work opposite the decrease in breakdown due to the curvature of the junction. Under some circumstances the decrease in breakdown voltage due to the curvature will be larger. In other circumstances the increase in breakdown voltage due to the reduction in concentration gradient can completely compensate for the decrease.

Figure 9A:
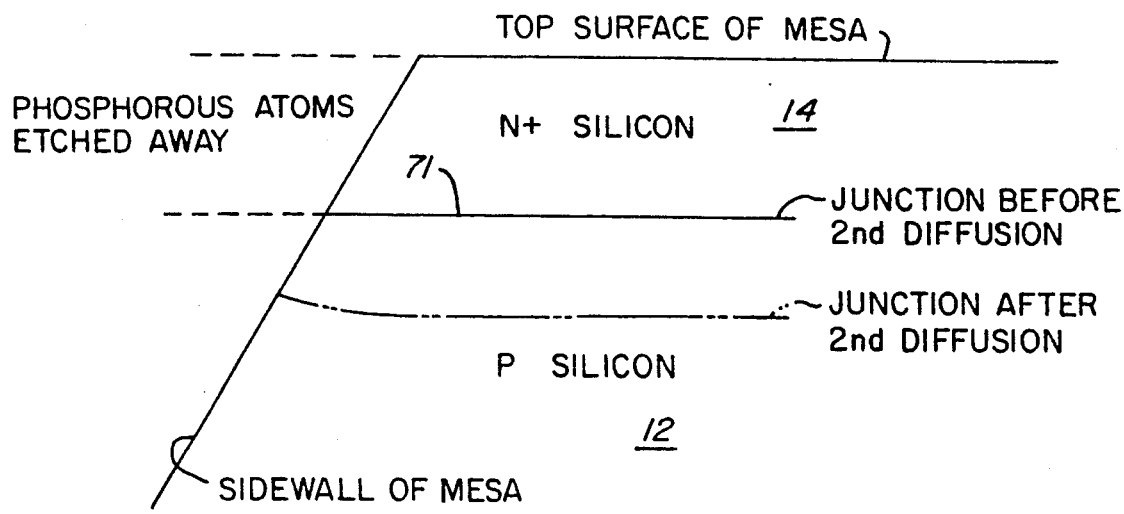
FIG. 9(a) demonstrates what happens to a plane P-N junction in a mesa structure having a sloped sidewall when a subsequent diffusion drives the N dopants deeper into the silicon. Because some of the phosphorus atoms were removed during the formation of the mesa, the diffusion front is convex relative to the N+ layer. This phenomena is described in detail in the earlier mentioned U.S. Pat. No. 4,740,477. It should be noted that the second diffusion step described below as part of the first embodiment of the present invention is implemented on the curved P-N junction illustrated in FIG. 9(c), and not on the plane P-N junction illustrated in FIG. 9(a).
Figure 9B:
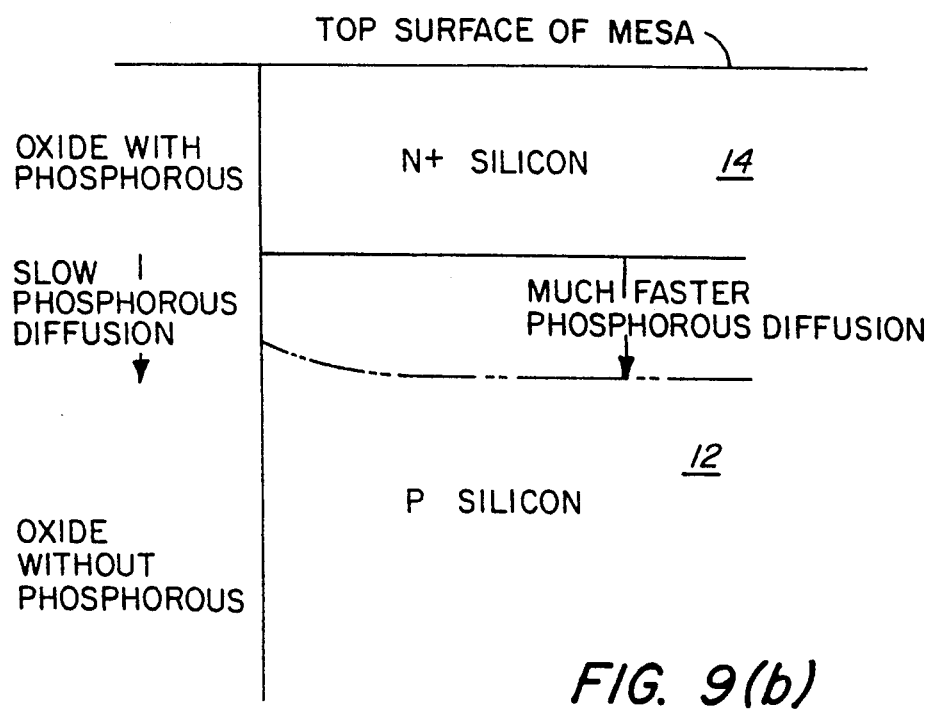
FIG. 9(b) demonstrates what happens to a plane P-N junction in a mesa structure having a perpendicular sidewall when a subsequent diffusion drives the dopants deeper into the silicon. The junction will have the tendency to curve upward because the diffusion of the phosphorus in the oxide progresses much slower than the diffusion of the phosphorus in the silicon. As a result, the phosphorus front along the oxide will pass oxide with little or no phosphorus and some of the phosphorus of the front will move into the oxide. The phosphorus front bordering the oxide will lose phosphorus atoms sideways to the oxide, and the phosphorus front along the oxide will progress more slowly than the average phosphorus front in the bulk of the silicon. It should be noted that the second diffusion step described below as part of the first embodiment of the present invention is implemented on the curved P-N junction illustrated in FIG. 9(c), and not on the plane junction illustrated in FIG. 9(b).
Figure 9C:
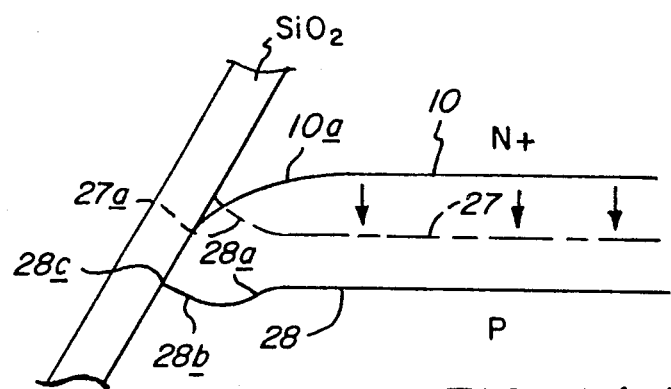
FIG. 9(c) is a schematic diagram illustrating in upper solid line the o-N junction of FIG. 8, and in broken line the general effect of a second diffusion step. The P-N junction resulting after the second diffusion step is illustrated by the lower solid line; the curvature of which junction is exaggerated.
Figure 10:
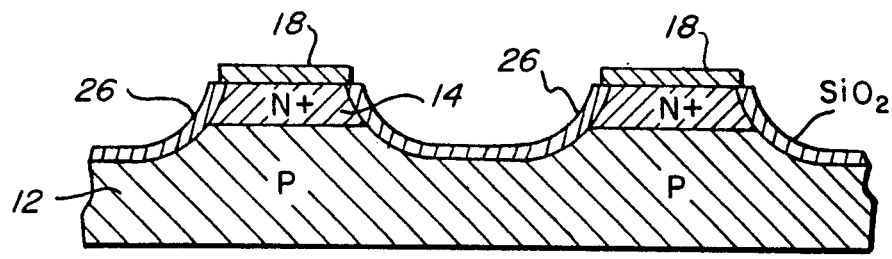
FIG. 10 is a view in cross-section, not to scale, taken along the same plane as FIG. 6, of the mesa structure after the second diffusion step illustrated schematically in FIG. 9(c). However, the small curvature of the P-N junction adjacent to the oxide is not shown because at this scale the curvature is too small to be shown.
Figure 11:
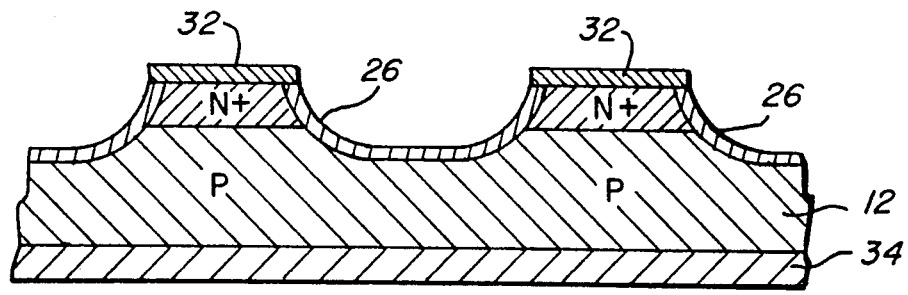
FIG. 11 is a view, not to scale, taken along the same plane as FIG. 10, of the mesa structure of FIG. 10 after the silicon nitride mask islands have been removed and metallic electrodes provided.

Next, according to this embodiment of the present invention, the N+ layer 14 is driven or diffused deeper into the mesa. By way of example, this second diffusion step is implemented at 1250° C. for 45 minutes in nitrogen gas and tends to flatten the P-N junction for two reasons. Firstly, as described in U.S. Pat. No. 4,740,477, the slope of the mesa sidewalls tends to curve the P-N junction toward the N+ layer as shown in FIG. 9(a). Secondly, the oxide layer impedes the progress of the phosphorus front adjacent to the oxide layer as shown in FIG. 9(b). Thus, the progress of the phosphorus front proceeds more slowly adjacent to the surface of the mesa than in the middle or bulk of the mesa. These two effects of a resultant phosphorus diffusion front are schematically illustrated in FIG. 9(c) by line 27. A curved portion 27a of line 27 represents the lag of the diffusion front adjacent to the oxide layer relative to the progress of the diffusion front in the bulk of the silicon.

Also, some of the phosphorus of portion 27a of the front moves into the oxide layer. The overall result is that the phosphorus front progresses more slowly along the oxide than in the bulk of the silicon. This compensates for the concave curvature of the P-N junction which existed before the second diffusion step to yield a new, substantially flat P-N junction 28 illustrated in FIG. 9(c). It should be noted that in the first embodiment of the present invention, the second diffusion step is carried out on P-N junction 10 with curved portion 10a, and FIGS. 9(a) and 9(b) with their flat junctions are included only for the purpose of explaining the general effect of the second diffusion step.

Adjacent to the oxide layer, portions 28a and 28b of the P-N junction have slight curvatures. Portion 28a is concave relative to the N+ layer and portion 28b is convex relative to the N+ layer. However, the maximum dip is preferably less than or equal to 2 microns from the plane of the P-N junction 28 within the bulk of the mesa and, in the aforesaid example, is approximately 0.2 microns below the bulk plane. Now, the breakdown voltage adjacent to the oxide is greater after the second diffusion step than before because the P-N junction is now substantially plane or flat, and the increase in breakdown voltage due to the reduced concentration gradient now is greater than the decrease due to the slight curvature of the junction. Therefore, even though the P-N junction is not perfectly flat, the breakdown voltage is still larger adjacent to the oxide than in the bulk. Experiments with the present invention according to the aforesaid example have yielded P-N junctions with a reverse breakdown voltage of 18 volts and a reverse breakdown characteristic which shows bulk breakdown.

Next, according to the present invention, the silicon nitride island masks 18 are removed, for example, by a plasma etch, and then the upper exposed surface of N+ layer 14 and the lower exposed surface of P layer 12 are metalized to provide electrodes 32 and 34. Then, the substrate may be divided between the mesas 22 to yield individual rectifiers.

The following second embodiment of the invention has not been tested. In the second embodiment, all of the materials and the steps of the first embodiment from the beginning until and including the oxidation step are performed except that the oxidation is protracted, for example 10 hours at 1200° C. instead of 8 hours at 1100° C. Consequently, the oxidation step accomplishes not only the oxidation step but also the second diffusion step. During a first period of this oxidation/diffusion step, primarily oxidation occurs, and the oxidation tends to yield a concave P-N junction relative to the N+ layer similar to 10a of FIG. 8. During the remainder of the oxidation/diffusion step, little oxidation occurs because the oxide layer is already thick, and substantial diffusion occurs. The effect of the diffusion front of this second diffusion step is to curve the P-N junction toward the N+ layer as in FIG. 9(c), and the result of the oxidation/diffusion is a substantially flat or plane P-N junction similar to junction 28 in FIG. 9(c); the two effects caused by the oxidation/diffusion step compensate for one another. Because of the protracted oxidation step, a separate second diffusion step is not carried out. It is expected that the process according to the second embodiment will yield an approximately 18 volt breakdown device.

A third embodiment of the present invention utilizes the same materials and the same deposition step and first stage of the first diffusion step as in the first embodiment described above. However, there is no second or final stage of the first diffusion step as in the first embodiment. Rather, after implementing the first stage of the first diffusion step, the silicon nitride layer deposition step and masking step are implemented as in the first embodiment. Then, the wafer is etched as in the first embodiment, but only for one minute instead of 1½ minutes. This yields mesas having moats which are 20–25 microns deep. Then, the mesa sidewalls are oxidized as in the first embodiment, but only for 3 hours at 1100° C. instead of 8 hours at 1100° C. This yields a 1.1 micron thick oxide layer. There is no separate, second diffusion step. Rather, the oxidation step causes a second diffusion as in the second embodiment. The reason that the relatively short oxidation step provides an adequate second diffusion to re-curve and thereby flatten the P-N junction adjacent to the oxide layer is because the P-N junction immediately before the oxidizing step is relatively near to the top surface of the mesa; the lack of the second stage of the first diffusion step left the P-N junction shallow. The resultant device of the third embodiment of the present invention has a P-N junction shaped as illustrated in FIG. 9(c), which junction has an approximately 6.8 volt breakdown.

It should be appreciated from the foregoing descriptions of the present invention that one technique utilized to flatten the P-N junction is the provision of a second diffusion step after an oxidizing step to compensate for the curvature of the P-N junction caused by the oxidation. Thus, to yield P-N junctions with other breakdown voltages, it may be desirable to examine the profiles of the P-N junctions in tests after various stages in the second diffusion step, and to increase or decrease the second diffusion time and/or temperature such that the portion of the P-N junction adjacent to the oxide layer lies substantially in the plane of the P-N junction within the bulk of the mesa. It should also be understood that the second diffusion step can be carried out continuously with the oxidation step as in the second and third embodiments. It should also be noted that the breakdown voltage is based on the total diffusion time of both diffusion steps while the duration of the second diffusion step is selected to compensate for the curvature caused by the oxidizing step. For example, by making the second diffusion step 1 hour longer and the first diffusion step 1 hour shorter, the same bulk breakdown can be expected, while the breakdown voltage adjacent to the oxide will be much different.

As an alternative to the first, second and third embodiments of the present invention described above, a passivated, substantially flat P-N junction can also be produced as follows. Perform all the steps of the first embodiment in the aforesaid order except shorten the duration of the final stage of the first diffusion step to 1 hour (at 1250° C.) instead of two hours; switch the order of the second diffusion and oxidizing steps, i.e., carry out the second diffusion step before the oxidizing step (but after the etching step); extend the duration of the second diffusion step to 1 hour 45 minutes (at 1250° C.) instead of 45 minutes; and extend the duration of the oxidizing step to 16 hours (at 1100° C.) instead of 8 hours. In this case, the second diffusion step curves a plane P-N junction toward the N+ layer. In the manner illustrated in FIG. 9(a), the slope of the mesa sidewall causes, in part, the curvature. Then, the oxidizing step substantially flattens the P-N junction by curving the junction away from the N+ layer for the reasons noted above in the description of the first embodiment. The result is similar to P-N junction 28 illustrated in FIG. 9(c).

Figure 15:
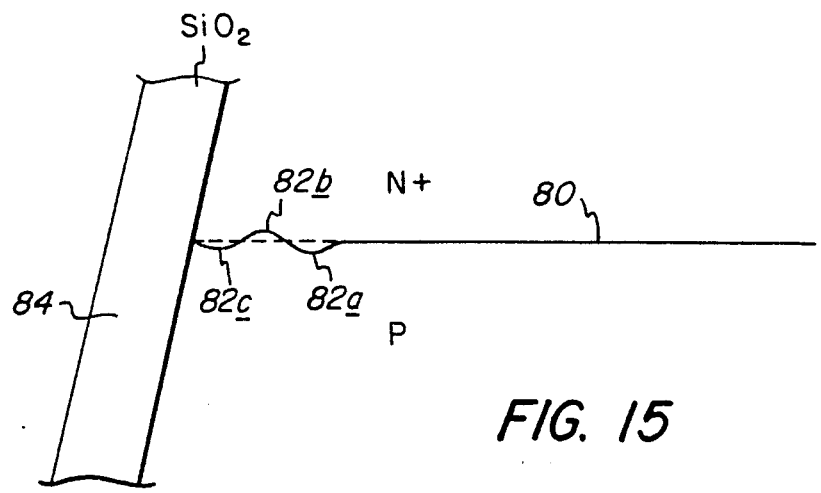
FIG. 15 is a diagram of a P-N junction resulting from a process in accordance with the present invention wherein two oxidation/diffusion steps are carried out after the mesa is formed.

The P-N junction 28 resulting from the oxidation/diffusion steps set forth above can be compared to a half cycle of a cosine wave. Further compensation for the curve caused by the initial oxidation step, resulting in an even flatter P-N junction, can be accomplished by providing additional oxidation and diffusion steps. For example, after the formation of the mesa structure as described above, two separate oxidation/diffusion steps can be undertaken to provide an improved, flatter P-N junction 80 as shown in FIG. 15. The shape of the P-N junction adjacent mesa sidewall 84 resembles a cosine wave of 1½ cycles, formed by portions 82a, 82b, and 82c. This structure is substantially flatter than the compensation designated at 28a, 28b, and 28c, of FIG. 9(c).

In order to form the improved, substantially flat P-N junction illustrated in FIG. 15, the mesa is prepared in the same way described above in connection with FIGS. 1-6. After the mesa is formed, the following oxidation and diffusion steps are carried out:

Oxidation 1100° C., 6 hrs. Steam
Diffusion 1250° C., 20 min, $N_2$
Oxidation 1100° C., 2 hrs, Steam
Diffusion 1250° C., 25 min, $N_2$ Additional compensation can be provided through the use of subsequent oxidation and compensating diffusion steps to further flatten the P-N junction adjacent the mesa sidewall. The optimal number of oxidation and compensating diffusion steps to be carried out after the formation of the mesa will depend upon cost and performance tradeoffs applicable to a particular device to be fabricated, as will be appreciated by those skilled in the art.

Based on the foregoing, processes for implementing the present invention as well as resultant semiconductor devices have been disclosed in accordance with the present invention. However, numerous modifications and substitutions may be made without deviating from the scope of the invention. For example, if desired, mesas with vertical sidewalls instead of the inclined sidewalls may be provided by a plasma etch in a gas environment with electrical charges to accelerate the gas molecules.

Also, if desired, a P-N junction corresponding to that of FIG. 1 could be formed by first diffusing a P layer or region into an N wafer, and then diffusing an N+ layer into the P layer. In this case, the subsequent mesa etches would penetrate entirely through the N+ layer and partially through the P layer. In still another embodiment of the invention, another P-N junction corresponding to that of FIG. 1 could be formed by first diffusing a P+ layer or region into a P wafer and then diffusing an N++ layer into the P+ layer. In this case, the subsequent mesa etches would penetrate entirely through the N++ layer and partially through the P+ layer.

Figure 12:
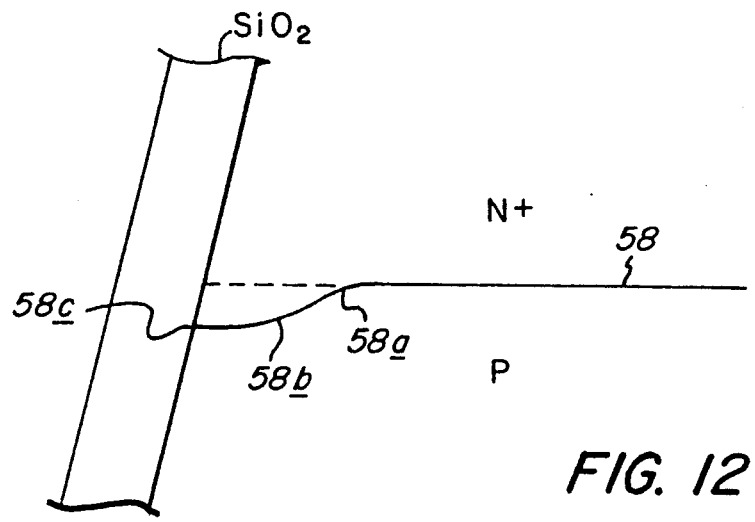
FIG. 12 is a schematic diagram of another P-N junction in accordance with the present invention with the curvature exaggerated.
Figure 13:
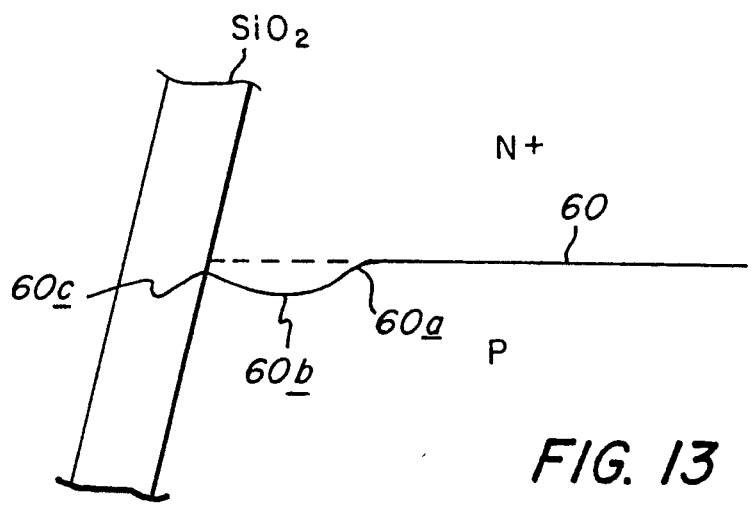
FIG. 13 is a schematic diagram of still another P-N junction in accordance with the present invention with the curvature exaggerated.
Figure 14:
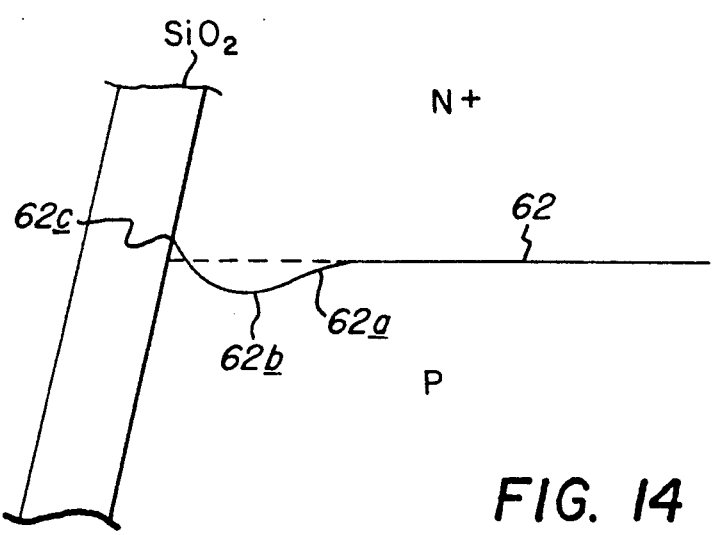
FIG. 14 is a schematic diagram of yet another P-N junction in accordance with the present invention with the curvature exaggerated.

Also, to form zener diodes with given breakdown voltages or other devices, the second diffusion step can be partially mismatched relative to the oxidation as illustrated in FIGS. 12, 13 and 14. Ends 58c and 60c of the P-N junctions adjacent to the associated oxide layers are below the bulk plane of the junction, and end 62c of the P-N junction adjacent to the associated oxide layer is above the bulk plane of the junction. Normally, ends 58c and 60c are less than 0.5 microns below the bulk plane but can be up to 2 microns below the bulk plane, and normally end 62c is less than 0.5 microns above the bulk plane but can be up to 4 microns above the bulk plane. In each case, the curvature includes a concave portion 58a, 60a or 62a relative to the N+ layer, and a convex portion 58b, 60b or 62b relative to the N+ layer. In all three cases, the breakdown voltage adjacent the oxide layer is higher than the bulk breakdown. It is also higher than it would be without the second diffusion, but less than it would be with a perfect match.

Also, in other embodiments of the invention, the oxidation is carried out at other temperatures preferably greater than 1,000° C. Therefore, the invention has been disclosed by way of illustration and not limitation, and reference should be made to the following claims to determine the scope of the invention.

What is claimed is:

1. A process for fabricating a semiconductor device comprising the steps of:
   providing a semiconductor wafer having a P-type region and an N-type region forming a P-N junction;
   forming a mesa structure in said wafer, said P-N junction extending entirely across said mesa and intersecting a sidewall thereof;
   diffusing said P-N junction into said P region within said mesa with a diffusion front that tends to curve the P-N junction toward said N region in the vicinity of the mesa sidewall;
   oxidizing the sidewall of said mesa structure, whereby the oxidation curves said P-N junction toward said P region in the vicinity of the oxidation; and
   controlling said diffusion and oxidation steps to yield a P-N junction having a desired profile adjacent said mesa sidewall.

2. The process of claim 1 comprising the further step of:
   performing said diffusion for a time period sufficient to provide a desired breakdown voltage for the semiconductor device.

3. The process of claim 1 wherein said diffusion and oxidation steps are implemented as one continuous step in an oxidizing environment.

4. The process of claim 3 comprising the further step of:
   performing the continuous diffusion and oxidation step for a time period sufficient to provide a desired amount of passivation and a desired breakdown voltage for the semiconductor device.

5. The process of claim 1 comprising the additional steps of:
   performing a plurality of diffusions and oxidations to more precisely control the profile of the P-N junction adjacent said mesa sidewall.

6. The process of claim 5 wherein said plurality of diffusions and oxidations is performed to provide a wiggle resembling at least one and one-half cycles of a cosine wave in the P-N junction adjacent said mesa sidewall.

7. The process of claim 1 wherein said diffusion and oxidation steps are controlled to provide a wiggle resembling at least one half cycle of a cosine wave in the P-N junction adjacent said mesa sidewall.

* * * * *

UNITED STATES PATENT AND TRADEMARK OFFICE
CERTIFICATE OF CORRECTION

PATENT NO. : 5,278,095
DATED : January 11, 1994
INVENTOR(S) : Einthoven, et al.

It is certified that error appears in the above-identified patent and that said Letters Patent is hereby corrected as shown below:

```
Title page, item [75],
The name of the first named inventor should read:

-- Willem G. Einthoven -- .
```

Signed and Sealed this

Seventeenth Day of May, 1994

*Attest:*

BRUCE LEHMAN

*Attesting Officer*  *Commissioner of Patents and Trademarks*